US010325048B1

(12) United States Patent
Chillarige et al.

(10) Patent No.: US 10,325,048 B1
(45) Date of Patent: Jun. 18, 2019

(54) VIRTUAL DIRECTORY NAVIGATION AND DEBUGGING ACROSS MULTIPLE TEST CONFIGURATIONS IN THE SAME SESSION

(71) Applicant: Cadence Designs Systems, Inc., San Jose, CA (US)

(72) Inventors: Sameer Chakravarthy Chillarige, Greater Noida (IN); Sonam Kathpalia, Noida (IN); Mehakpreet Kaur, Amritsar (IN); James S. Allen, Candor, NY (US); Krishna Vijaya Chakravadhanula, Vestal, NY (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days.

(21) Appl. No.: 15/379,261

(22) Filed: Dec. 14, 2016

(51) Int. Cl.
*H02J 7/00* (2006.01)
*G06F 17/50* (2006.01)

(52) U.S. Cl.
CPC .................. *G06F 17/504* (2013.01)

(58) Field of Classification Search
USPC ........... 714/25, 726, 727; 716/105, 106, 136
See application file for complete search history.

(56) References Cited

U.S. PATENT DOCUMENTS

| | | | | |
|---|---|---|---|---|
| 6,678,849 B1* | 1/2004 | Shiraishi | ........ | G01R 31/318544 714/727 |
| 7,412,672 B1* | 8/2008 | Wang | ................. | G01R 31/3177 716/106 |
| 7,426,461 B2* | 9/2008 | Nelson | ................. | G06F 17/5022 703/13 |
| 8,205,120 B2* | 6/2012 | Heidasch | ............ | G06F 11/3688 714/25 |
| 8,239,798 B1* | 8/2012 | Goyal | ................. | G06F 17/5031 716/113 |
| 8,863,052 B1* | 10/2014 | Dhuria | ................. | G06F 17/5036 716/108 |
| 2005/0268190 A1* | 12/2005 | Kapur | ............ | G01R 31/318536 714/726 |
| 2007/0288822 A1* | 12/2007 | Lin | ................. | G01R 31/318357 714/741 |
| 2010/0153795 A1* | 6/2010 | Goel | ............. | G01R 31/318328 714/726 |
| 2012/0112763 A1* | 5/2012 | Goel | ............. | G01R 31/318328 324/621 |
| 2013/0152047 A1* | 6/2013 | Moorthi | ................ | G06F 11/368 717/124 |

\* cited by examiner

*Primary Examiner* — Brian Ngo
(74) *Attorney, Agent, or Firm* — Tarolli, Sundheim, Covell & Tummino LLP

(57) ABSTRACT

An integrated circuit test method provides an interactive shell environment having analysis modules organized as a directory such that for a given session a user can access any of the analysis modules. This invention describes a virtual directory structure for navigating through the entire test data starting from design, test configuration, ATPG patterns, failure information and callout information. This structure also allows the creation of a scripting environment for the user to select a specific configuration and process the information. User can achieve all of this in a single session as opposed to working on every test configuration in an independent session.

12 Claims, 6 Drawing Sheets

VIRTUAL DIRECTORY NAVIGATION AND DEBUGGING ACROSS MULTIPLE TEST CONFIGURATIONS IN THE SAME SESSION

TECHNICAL FIELD

The field of the invention relates generally to hardware and software verification of logic circuits and more particularly relates to a method for analyzing and debugging test data in an interactive environment.

BACKGROUND

After being fabricated, integrated circuits (ICs) are tested for proper functional operation using a set of test vectors that contain test inputs and the expected test outputs. Test vectors generated by Automatic Test Pattern Generation (ATPG) software are applied to the chip or device under test (DUT) by an Automatic Test Equipment (ATE). The ICs that successfully passed all the test vectors are qualified as good whereas the ICs that failed on any of the test vectors are qualified as bad or defective. For the defective ICs, the failure information is collected by the ATE and stored in a buffer for further processing using diagnostics tools.

To achieve high fault coverage with low pattern count and facilitate ease of testing the integrated circuit (IC), test methodology is designed and implemented with multiple test configurations. Each configuration activates specific logic in the circuit and patterns are generated specific to the configuration. Debugging issues and reporting information across multiple test configurations is critical to determine the quality of results at the full chip level. FIG. 1 shows the process flow for testing different configurations. In a single session, single test configuration related information is processed by the tool. Once the information for all interested test configurations is available, the user post processes the information available in log files or any tool-supported techniques to collect the final results. This data is obtained by parsing through log files or through creation of custom scripts.

There are challenges with the aforementioned approach. First, a special set-up is established to post-process the information collected from various sessions. Second, navigation and interactive debug of information across multiple test configurations are not available. This data is required for continuous assessment of quality of results at the chip level. Third, a scripted environment to explore multiple test configurations is challenging in this structure.

DETAILED DESCRIPTION

The following description of embodiments provides non-limiting representative examples referencing numerals to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

According to an embodiment, an automatic test pattern generation (ATPG) system is one for testing the operation of an integrated circuit partitioned into a plurality of regions, where each region includes a corresponding group of scan channels, and scan channels located in a similar physical region of the integrated circuit are grouped together. The ATPG system includes a plurality of clock gates, where each of the clock gates selectively controls a plurality of scan flops of the groups of scan channels. The ATPG system also includes a processor that is configured to enable and disable clock gates coupled to the scan flops. Embodiments of the invention describe a virtual directory structure for navigating through the entire test data starting from design, test configuration, ATPG patterns, failure information and call-out information. This structure also allows the creation of a scripting environment for the user to select a specific configuration and process the information. The user can achieve all of this in a single session as opposed to working on every test configuration in an independent session.

One aspect of the present invention is a method for analyzing and debugging test data for different modes in a single session in an interactive environment. A test configuration is organized and accessed as a directory. The plurality of test configurations is accessed in an interactive shell environment.

Figure 1:
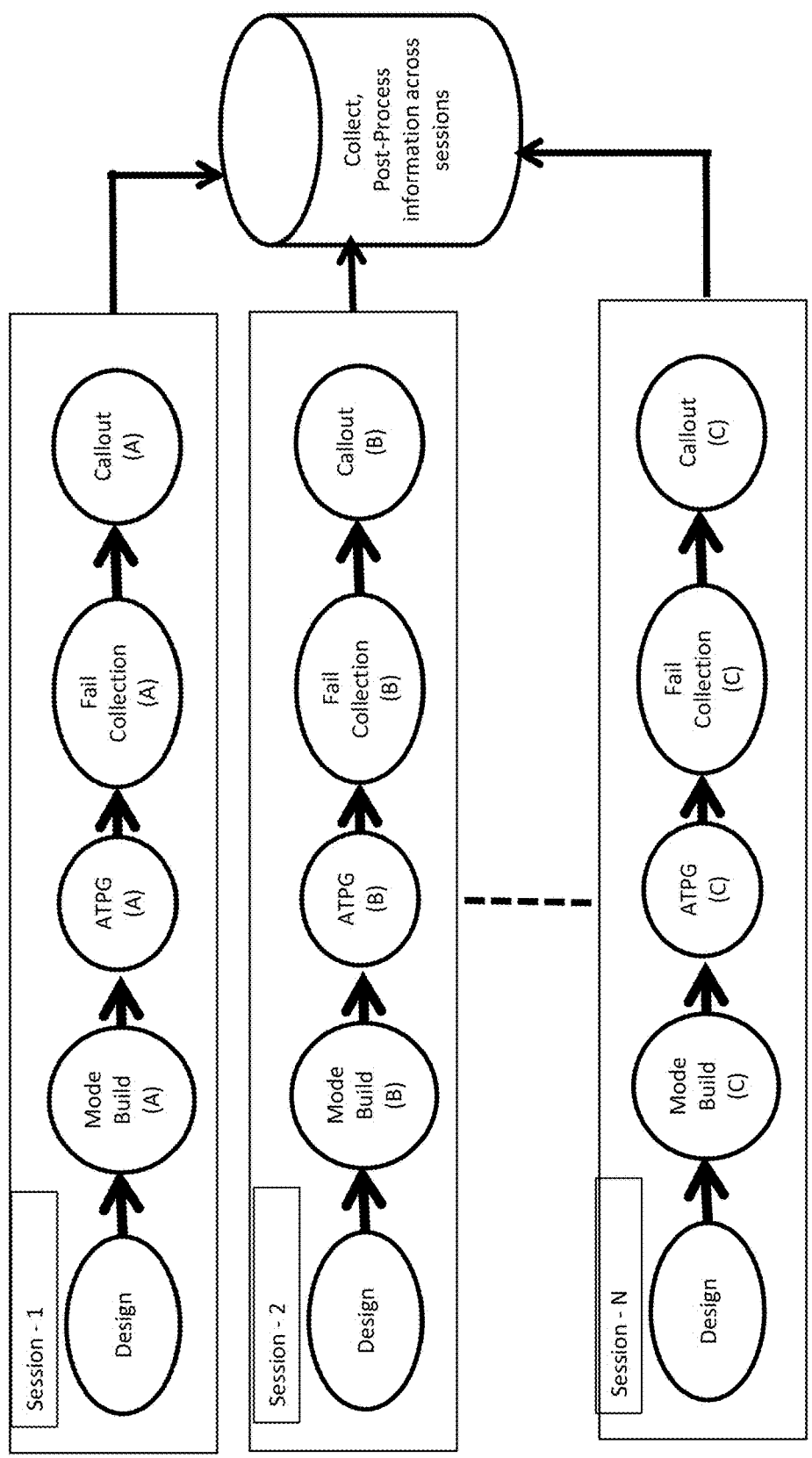
FIG. 1 is a process flowchart illustrating a single session test configuration of the prior art.

In the prior art, shown in FIG. 1, the user is limited to a single test configuration for each test session. A netlist for this specific design is built. A corresponding ATPG pattern of vectors is generated. This pattern is applied during fault simulation. The results from the fault simulation are presented in the callout. If the user wants to make a minor change, e.g. the ATPG pattern of vectors to test a different output pin, the user must start the single session at the beginning, e.g. entering the design description. Once the information for all interested test configurations is available, the user post processes the information available in log files or any tool-supported techniques to collect the final results. This data is obtained by parsing through log files or through creation of custom scripts. This can be a tedious process as the user cannot leverage data between the sessions.

In embodiments of the present invention, an integrated circuit test system and method provide an interactive shell environment for accessing a plurality of testing configurations related to a specific design during a single session, each test configuration is organized as a directory. Within the interactive shell environment, a user can modify input related to one of the test configurations. The test application receives the modified input and generates related output.

At the top level or root of the directory is an integrated circuit (IC) definition module. The IC definition module describes the IC using a hardware description language, e.g. Verilog or VHDL. The reporting module can report results from a single session or an aggregate of test sessions. This structure allows the designer to leverage data in the middle of the test stream.

The IC definition module includes files describing an integrated circuit. The files are written in hardware description language. The netlists can be physical or logical, instance-based or net-based, and flat or hierarchical. The latter can be either folded or unfolded.

In an embodiment, the netlist is a representation of the technology cells (e.g., design for testability (DFT) logic, scan flops, etc.) and all of their interconnections in the circuit. One type of additional file includes a library which includes the collection of technology cells that are utilized to generate the netlist. The library includes, for example, Verilog files corresponding to the logical and timing representations of the technology cells. Another additional file is SDF data which includes timing data for the technology cells and associated interconnections. As such, based on the retrieved information from the circuit design model data, a timing-aware model build representing all of the technology cells and interconnections in the circuit (with corresponding logic) can be generated. In an illustrative embodiment, the user may directly modify the timing model associated with the netlist rather than modify the IC description and recompiling the file.

The test application, e.g. fault simulation module, receives the set of test files and description of the integrated circuit. The fault simulator applies the test patterns to the description of the integrated circuit and generates corresponding result files.

A reporting module receives the corresponding result files. A reporting application either reports the results or further analyzes the results.

The virtual test structure directory allows navigation and debugging through multiple test configurations/patterns/failsets/callouts in the same interactive session. Further, within a module, the test files can be duplicated while maintaining the bindings to the parent module. To illustrate, time associated with developing multiple test configurations and generating ATPG patterns for each test configuration is reduced when compared to a single session test system because the information related to each test configuration and generated ATPG patterns and the fault status information associated for each pattern set are saved. For example, for every failing manufactured IC chip, a failure file is generated and a diagnostics application produces a root cause location in a callout report. Each failure file and corresponding callout report is part of the directory structure described herein. If the user reads in failure files for multiple failing IC chips, all the information will be available and accessible through the directory structure and analysis applications can be developed on top of such a structure. This directory structure and analysis infrastructure may significantly ease the process of determining a common root cause of failures in a manufactured IC chips (e.g., during a yield ramp process).

This architecture allows on-demand loading of test configuration and pattern information in an interactive session for visualization, debug, and scripting purposes. The virtual directory structure allows the user to navigate through the entire test data starting from design, test configuration, ATPG patterns, failure information, and callout information. This structure also allows the creation of a scripting environment for the user to select a specific configuration and process the information. The user can do this in a single session.

Figure 2:
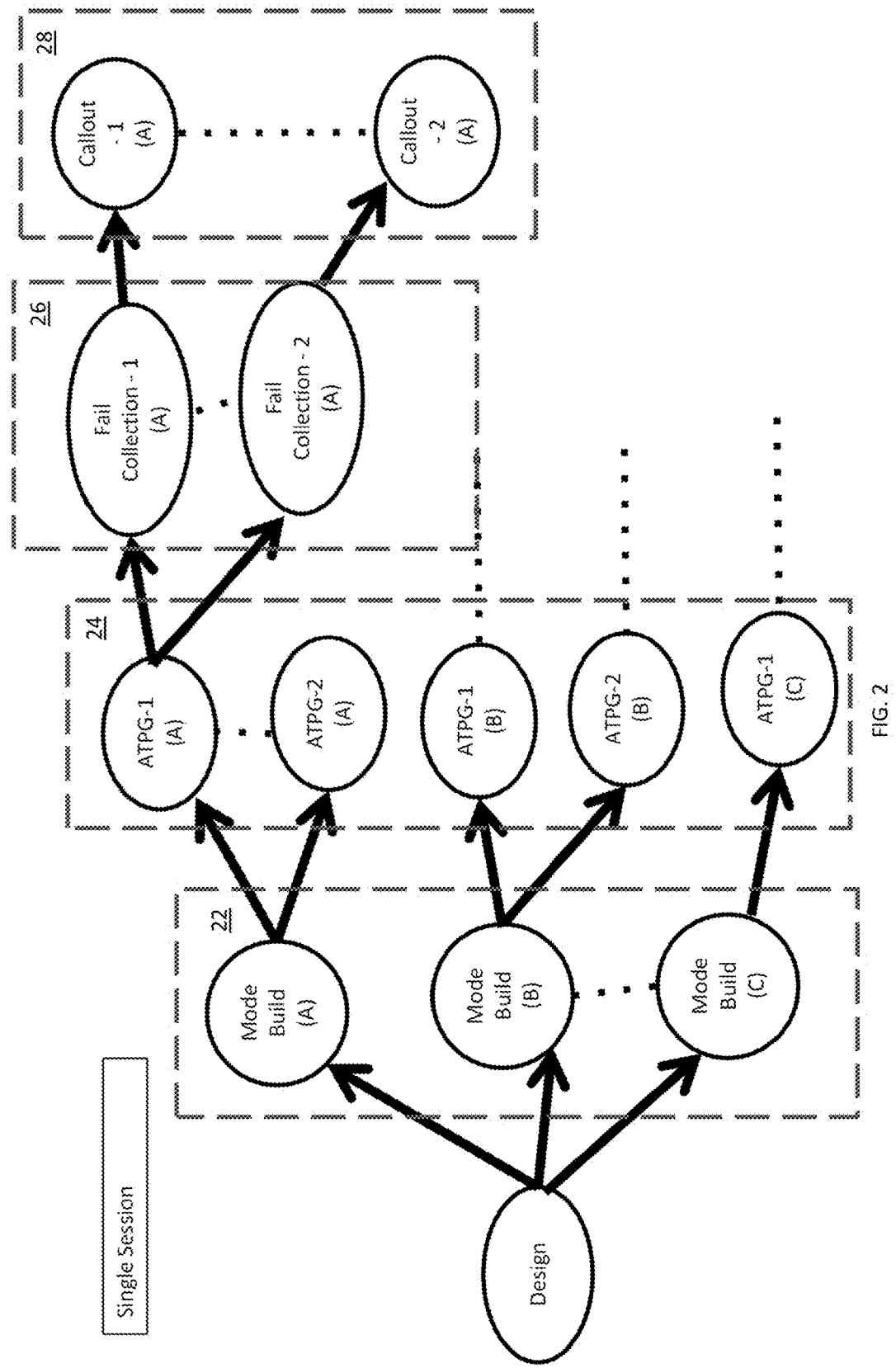
FIG. 2 is a process flowchart of an embodiment of the present invention.

FIG. 2 illustrates the navigation and debugging across multiple test configurations for an interactive session using the virtual directory.

In the first stage 22, a user describes the integrated circuit using a high level logic design language, e.g. Verilog and VHDL. Netlists are generated corresponding to the high level logic design language description and the build application selected. The types of modes include but are not limited to fullscan and compression.

In the second stage 24, the ATPG patterns, e.g. vectors, for the netlist are generated. The type of ATPG patterns include but are not limited to stuck-at, at-speed, and faster-than-at-speed testing, pattern re-use for hierarchical testing, high quality ATPG, power-aware ATPG, and distributed processing.

In the third stage 26, the results from each of the diagnostic applications are stored.

In the fourth stage 28, a reporting module reports the results from the diagnostics. Alternatively, the reporting module may perform comparisons across results of multiple diagnostics, e.g. the aggregate report displays the faults and test modes that discovered the fault. To illustrate, a combined report reflecting comparisons across a given set of ATPG patterns, e.g. an aggregate report displays the faults and the associated observe_chain_paths. In another illustrative example, the aggregate report displays directories of the integrated circuit and faults associated with each module.

Figure 3:
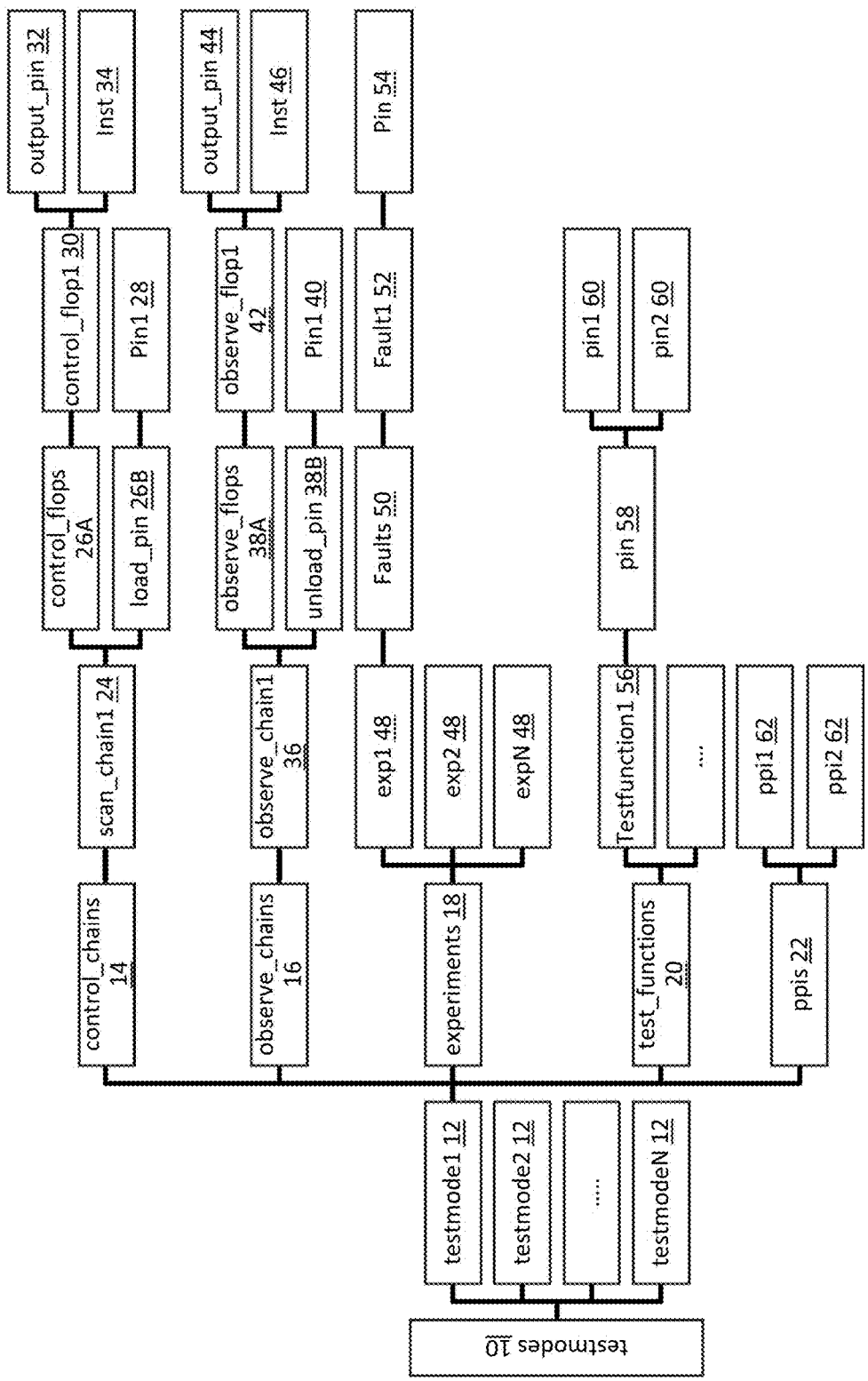
FIG. 3 shows the virtual directory structure for the flowchart of FIG. 2.

FIG. 3 shows a sample directory structure to support the interactive design session of FIG. 2. The files are stored in a hierarchical tree structure. The top node is the testing directory 10. The testing directory 10 stores the available testmodes 12. Each test mode 12 is parent to utilities or test input files needed for that test mode. The utilities are stored as sub-directories, e.g. control_chains 14, observe_chains 16, experiments 18, test_functions 20, and ppis 22.

The subdirectory control_chains 14 stores a plurality of subdirectories, each sub-directory corresponding to a scan_chain 24. Each scan_chain 24 is parent to control_flops 26A and a load_pin 26B. The load_pin 26B is parent to pin1 28. The control_flops 26A is parent to control_flops of interest 30, e.g. control_flop1. Each control_flop of interest 30 is parent to an output_pin 32 and an instance 34.

The subdirectory observe_chains 16 is parent to a plurality of observe_chain 36. Each observe_chain 36 is parent to observe_flops 38A and an unload_pin 38B. The unload_pin 38B is parent to unload pin1 40. The observe_flops 38A is parent to observe_flops of interest 42. Each observe_flop of interest 42 is parent to an output_pin 44 and an instance 46.

The subdirectory experiments 18 is parent to subdirectories of experiments 48. Each experiment 48 includes a corresponding subdirectory of faults 50. The subdirectory of faults 50 is parent to an individual fault 52, e.g. fault 1. The individual fault 52 is parent to the identified pin 54, e.g the probed pin that identifies the fault.

The subdirectory test functions 20 is parent to subdirectories of test functions 56. Each test function is parent to a pin directory 58. Each pin directory 58 is parent to individual test pins 60.

The subdirectory ppis 22 is parent to the plurality of ppi 62. This directory contains the pseudo primary inputs.

Figure 4A:
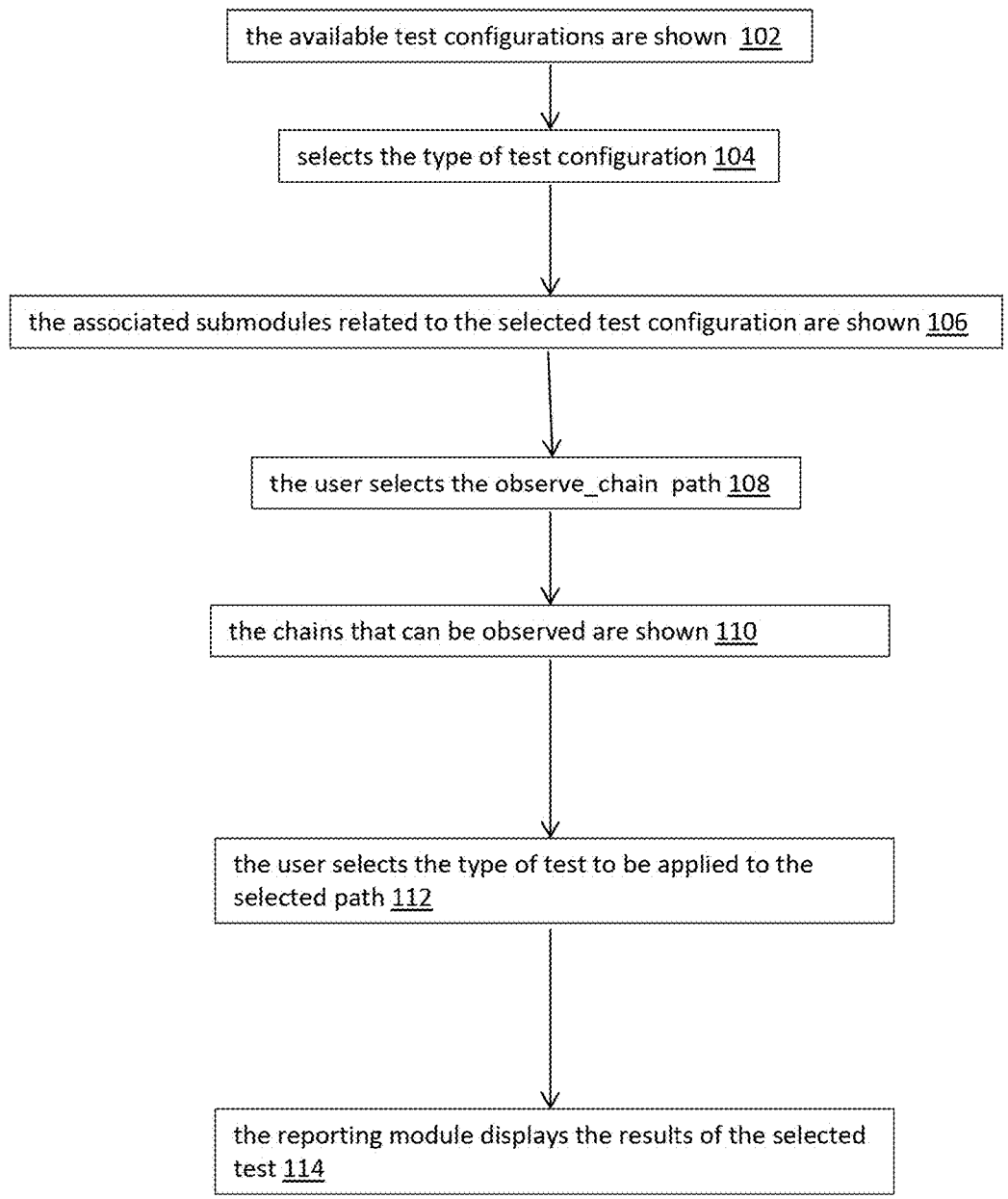
FIG. 4A shows an illustrative process flowchart for accessing each of the test directories.
Figure 4B:
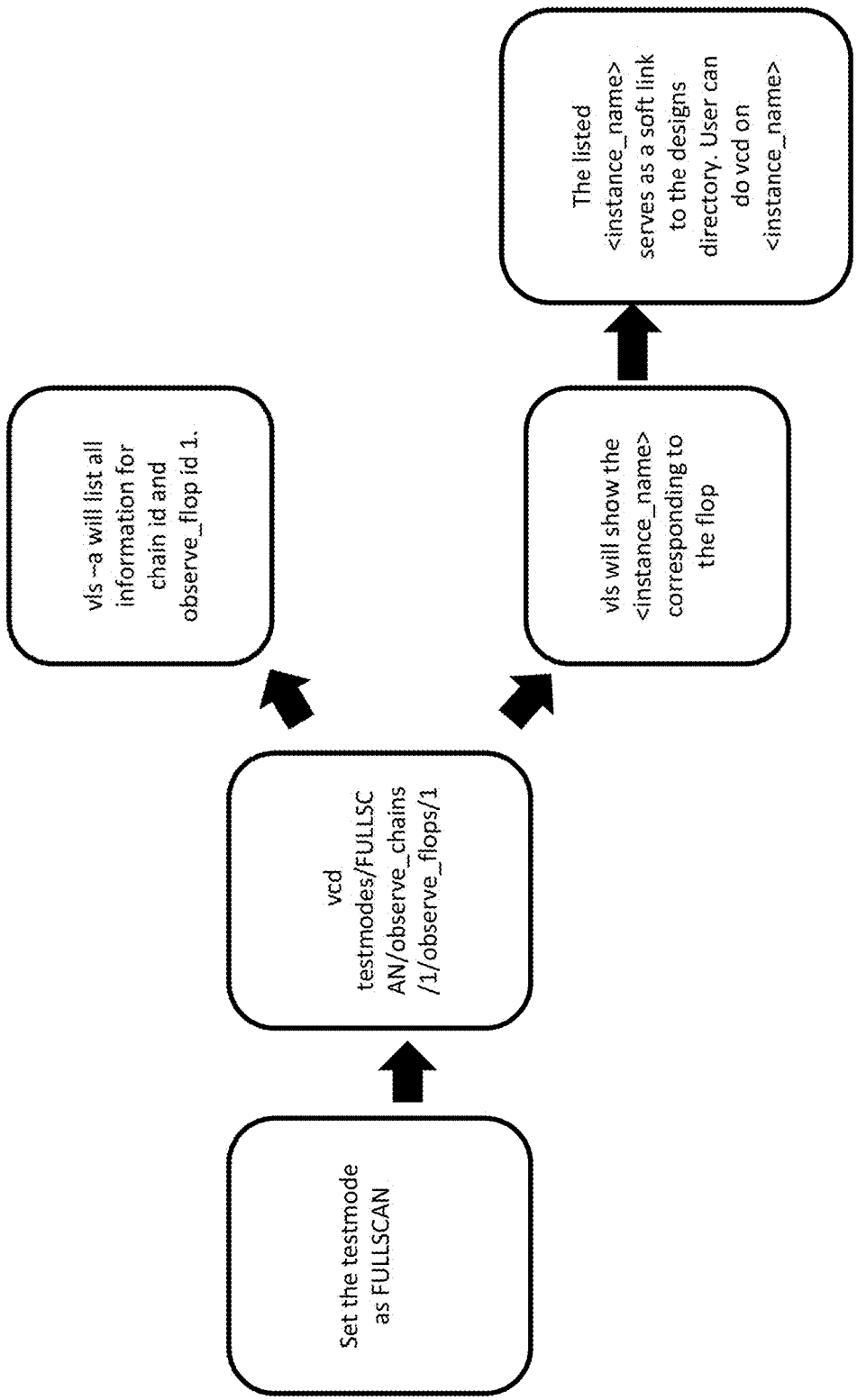
FIG. 4B is an illustrative example of the corresponding design session.

FIG. 4A shows an illustrative process flowchart for accessing each of the test directories. FIG. 4B is an illustrative example of the corresponding design session. In step 102, the available test configurations are shown. In step 104, the user selects the type of test configuration. In step 106, the associated subdirectories/directories related to the selected test configuration are shown. In step 108, the user selects the observe_chain path. In step 110, the chains that can be observed are shown. In step 110, the user selects the type of test to be applied to the selected path. In step 112, the reporting module displays the results of the selected test. At any point in the aforementioned flowchart, the user can start a new test session.

When embodiments of the present invention are contrasted with the single test session method, the time associated with the test session is shortened as the redundant steps are eliminated from the process. In one illustrative example, the user can quickly select different observe_chain_paths by starting the test session at step 108. Alternatively, the user can start at step 110 and select a different type of test. After setting the desired testmode, the user can directly reach at step 110 by doing "vcd observe_chain:<chain_id>.

Figure 5:
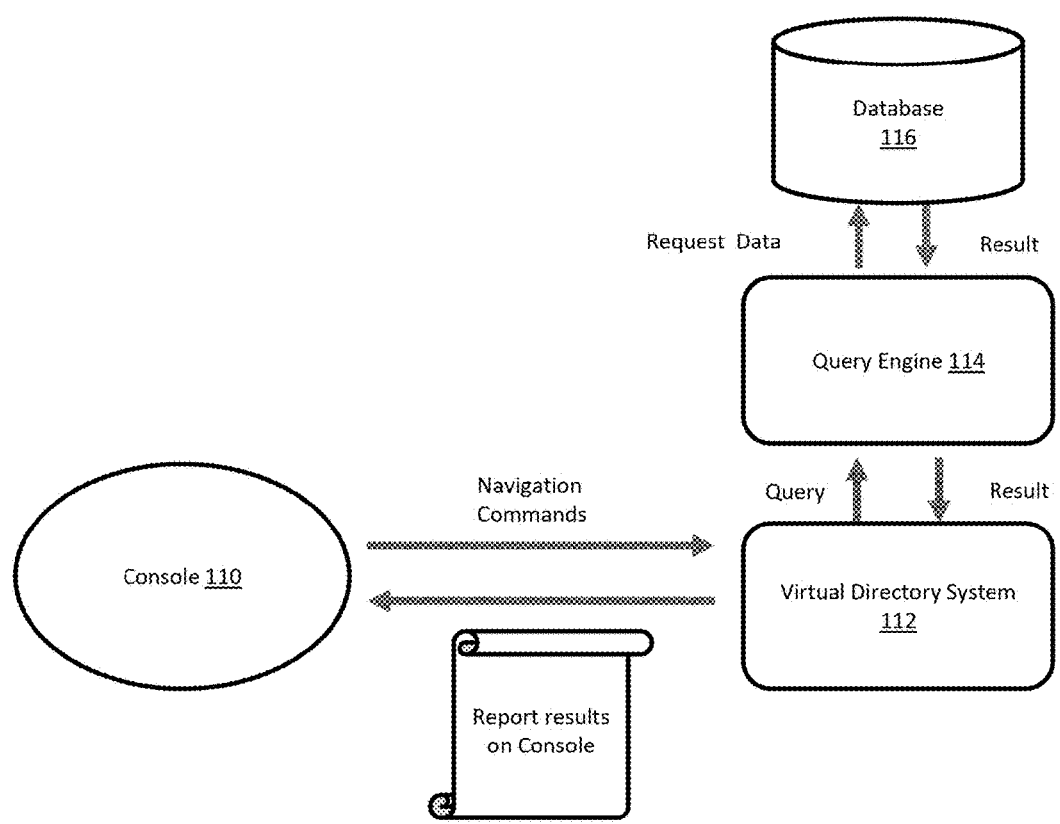
FIG. 5 is an illustrative example of a system for implementing embodiments of the present invention.

FIG. 5 is an illustrative example of a system for implementing embodiments of the present invention. A user inputs navigation commands on a console 110. The virtual directory system 112 receives the navigation commands and transmits them to a query engine 114. The query engine 114 requests and receives data from a database 116. The results are displayed on the console 10.

In operation, the shell environment and the virtual directory system 112 retrieves requests and directs them to the appropriate data sources by abstracting the data. The virtual directory integrates data from multiple heterogeneous data sources and presents it as though it were coming from a single source.

While the present invention has been described for post fabrication integrated circuits, the concept can be extended to design of the integrated circuits, e.g. prior to fabrication. To illustrate, the netlist can be modified to reflect the physical layout of the directory. Alternatively, the associated file for the netlist can be modified to reflect a different fabrication process.

In the foregoing Description of Embodiments, various features may be grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Embodiments, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the disclosure, as claimed. Thus, it is intended that the specification and examples be considered as exemplary only, with a true scope of the present disclosure being indicated by the following claims and their equivalents.

We claim:

1. A system for testing an integrated circuit, comprising:
a console to execute a test application for integrated circuit, wherein
for a single test session for an integrated circuit,
a plurality of test configurations are to be organized and accessed as a directory, each test configuration including,
an integrated circuit definition module that describes the integrated circuit, and
a first set of test input files for the integrated circuit,
said console to execute the test application and (i) generate a timing-aware model based on the integrated circuit definition module and (ii) modify the timing-aware model for a netlist associated with the integrated circuit, and
in an interactive shell environment to test the integrated circuit, wherein the interactive shell environment comprises a query engine and virtual directory system, said console to execute the test application and to:
receive the integrated circuit definition module, the timing-aware model, and the first set of test input files,
duplicate at least one test input file in the first set of test input files,
generate one or more test results, and
at least one of (i) report the one or more test results using a reporting module or (ii) analyze the one or more test results using the reporting module.

2. The system as in claim 1, further comprising a modified set of test input files; and
the test application to generate one or more further test results based on the modified set of test input files.

3. The system as in claim 1, wherein the test application is to generate the one or more test results in full scan mode.

4. The system as in claim 1, wherein the test application is to generate the one or more test results in compression mode.

5. The system as in claim 1, wherein said first set of test input files includes failure files and callout reports organized and accessed in said directory.

6. A method for testing a fabricated integrated circuit, comprising:
in an interactive shell environment for a single test session, wherein the interactive shell environment comprises a query engine and virtual directory system;
accessing a plurality of test configurations as a directory, each test configuration including an integrated circuit definition module that describes the fabricated integrated circuit and a first set of test input files for the fabricated integrated circuit;
generating a timing-aware model based on the integrated circuit definition module;
modifying the timing-aware model for a netlist associated with the integrated circuit;
receiving the integrated circuit definition module, the timing-aware model, and the first set of test input files;
duplicating at least one test input file in the first set of test input files;
testing the fabricated integrated circuit by generating one or more test results by applying the integrated circuit definition module, the timing-aware model, and test input files to a test application; and
at least one of (i) reporting the one or more test results using a reporting module or (ii) analyzing the one or more test results using the reporting module.

7. The method as in claim 6, further comprising:
generating a second set of test input files; and
generating one or more further test results by applying the integrated circuit definition module and second set of test input files.

8. The method as in claim 6, wherein the test application generates the one or more test results in full scan mode.

9. The method as in claim 6, wherein the test application generates the one or more test results in compression mode.

10. The method as in claim 6, wherein said first set of test input files includes failure files and callout reports organized and accessed in said directory.

11. A non-transitory computer readable medium containing program instructions for testing a fabricated integrated circuit, wherein execution of the program instructions by one or more processors of a computer system causes one or more processors to perform the following:
- in an interactive shell environment for a single test session, wherein the interactive shell environment comprises a query engine and virtual directory system,
- accessing a plurality of test configurations as a directory, each test configuration including an integrated circuit definition module that describes the fabricated integrated circuit and a first set of test input files for the fabricated integrated circuit;
- generating a timing-aware model based on the integrated circuit definition module;
- modifying the timing-aware model for a netlist associated with the integrated circuit; receiving the integrated circuit definition module, the timing-aware model, and the first set of test input files;
- duplicating at least one test input file in the first set of test input files;
- testing the fabricated integrated circuit by generating one or more test results by applying the integrated circuit definition module, the timing-aware model, and test input files to a test application; and
- at least one of (i) reporting the one or more test results using a reporting module or (ii) analyzing the one or more test results using the reporting module.

12. The non-transitory computer readable medium as in claim 11, further comprising:
- generating a second set of test input files; and
- generating one or more further test results by applying the integrated circuit definition module and second set of test input files.

* * * * *